(12) United States Patent
Carelli, Jr.

(10) Patent No.: US 7,444,275 B2
(45) Date of Patent: Oct. 28, 2008

(54) MULTI-VARIABLE POLYNOMIAL MODELING TECHNIQUES FOR USE IN INTEGRATED CIRCUIT DESIGN

(75) Inventor: John A. Carelli, Jr., Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 489 days.

(21) Appl. No.: 11/187,455

(22) Filed: Jul. 22, 2005

(65) Prior Publication Data

US 2007/0022392 A1   Jan. 25, 2007

(51) Int. Cl.
*G06F 7/60* (2006.01)
*G06F 17/50* (2006.01)
*G06F 11/00* (2006.01)
*G06F 9/45* (2006.01)
*G01R 15/00* (2006.01)
*G01R 31/00* (2006.01)
*G01R 27/28* (2006.01)
*G06K 5/04* (2006.01)

(52) U.S. Cl. ............... 703/14; 702/57; 702/58; 702/117; 702/118; 703/2; 703/13; 714/100; 714/699; 714/781; 714/741; 714/798; 716/1; 716/4; 716/5; 716/7

(58) Field of Classification Search ............... 703/14, 703/2, 13; 702/57, 58, 117, 118; 714/100, 714/699, 741, 781, 798, 799; 716/1, 4, 5, 716/7
See application file for complete search history.

(56) References Cited

U.S. PATENT DOCUMENTS

| 5,692,160 | A | | 11/1997 | Sarin |
|---|---|---|---|---|
| 6,003,151 | A | * | 12/1999 | Chuang ................ 714/752 |
| 6,028,995 | A | | 2/2000 | Jetton et al. |
| 6,090,152 | A | | 7/2000 | Hayes et al. |
| 6,173,240 | B1 | * | 1/2001 | Sepulveda et al. ....... 703/2 |
| 6,272,664 | B1 | | 8/2001 | Chang et al. |
| 6,615,164 | B1 | * | 9/2003 | Gopisetty et al. ........ 703/2 |
| 6,640,327 | B1 | * | 10/2003 | Hallberg ............. 714/785 |
| 6,850,871 | B1 | * | 2/2005 | Barford et al. .......... 703/2 |
| 7,039,880 | B2 | * | 5/2006 | Kan ..................... 716/2 |
| 7,369,974 | B2 | * | 5/2008 | Yang et al. ............ 703/2 |

OTHER PUBLICATIONS

Yanilmaz et al. "Numerical Device Modeling for Electronic Circuit Simulation" IEEE 1991.*

(Continued)

*Primary Examiner*—Kamini Shah
*Assistant Examiner*—Shambhavi Patel
(74) *Attorney, Agent, or Firm*—Ryan, Mason & Lewis, LLP

(57) ABSTRACT

Techniques are disclosed for modeling a cell of an integrated circuit design. In one aspect of the invention, a full-space polynomial model is fit to cell information comprising measured data points associated with one or more independent variables such as voltage slew, capacitive load, supply voltage or temperature. Error values are generated indicative of error between the measured data points and the full-space polynomial model. The error values are used to partition the modeling space into domains. For at least a given one of the domains, a first polynomial model is generated based on a subset of the measured data points and at least one additional data point determined by interpolation from the measured data points in the subset. Error values are generated indicative of error between the measured data points of the subset and the first polynomial model. A shifted model is generated by applying correction factors determined from the error values to respective data points taken from the first polynomial model. A second polynomial model of the given domain is generated by fitting to a plurality of data points from the shifted model.

20 Claims, 5 Drawing Sheets

OTHER PUBLICATIONS

Yanilmaz et al. "Numerical Device Modeling for Electronic Circuit Simulation" IEEE 1991.*

Smith et al. "Polynomial Circuit Models for Component Matching in High-Level Synthesis" IEEE Transactions on Very Large Scale Integration (VLSI) Systems, vol. 9, No. 6, Dec. 2001.*

F. Wang et al., "Scalable Polynomial Delay Model for Logic and Physical Synthesis," Synopsys Inc., 6 pages, 2000.

"Accurate Multi-Voltage Delay Analysis," Cadence Technical Paper, Cadencec Design Systems, Inc., 8 pages, 2004.

* cited by examiner

```
cell_rise(template_name) {
  index_1 ("0.014718, 0.037938, 0.126436, 0.301458, 0.579498, 0.974884, 1.499998" );
  index_2 ("0.000000, 0.002971, 0.014265, 0.036617, 0.072150, 0.122668, 0.189767, 0.274900" );
  values(\
   "0.014860, 0.021145, 0.043038, 0.084069, 0.149010, 0.241489, 0.364250, 0.520014",\
   "0.019672, 0.027415, 0.050552, 0.091930, 0.157065, 0.249603, 0.372395, 0.528211",\
   "0.030493, 0.042491, 0.074937, 0.122745, 0.189748, 0.282454, 0.405242, 0.561061",\
   "0.044102, 0.060226, 0.105446, 0.168604, 0.247473, 0.346093, 0.470695, 0.626686",\
   "0.059331, 0.080460, 0.138339, 0.219292, 0.317380, 0.432267, 0.567596, 0.728923",\
   "0.077257, 0.102931, 0.173484, 0.272434, 0.391908, 0.528914, 0.683959, 0.860352",\
   "0.097944, 0.127809, 0.210976, 0.327781, 0.468964, 0.630209, 0.809875, 1.008865" );
}
```

MULTI-VARIABLE POLYNOMIAL MODELING TECHNIQUES FOR USE IN INTEGRATED CIRCUIT DESIGN

FIELD OF THE INVENTION

The present invention relates to the field of integrated circuit design and, more specifically, to techniques for modeling of cell propagation delay, output voltage slew, timing constraints, power consumption, capacitive load or other cell information in cell-based integrated circuit design.

BACKGROUND OF THE INVENTION

The computer-aided design of an integrated circuit typically involves interconnecting various building blocks, commonly referred to as cells, which perform specified circuit functions. Such cells may correspond, for example, to particular predetermined arrangements of one or more logic gates, flip-flops, latches, etc. In order to determine if the overall circuit meets timing requirements, it is important to have accurate models of signal propagation delay through each of the cells. Other types of cell information, including, for example, output voltage slew, timing constraints such as setup and hold times, power consumption, and capacitive load, can also be modeled. Such models also help the designer optimize circuit performance while avoiding metastable conditions.

In an example of typical conventional practice, the cell propagation delay is modeled as a function of at least two independent variables, such as input voltage slew and output capacitive load. In one approach of this type, delay measurements are obtained, using circuit simulation software such as SPICE, for different values of input voltage slew and output capacitive load. The measured data points are stored in a two-dimensional (2D) table indexed by the particular input voltage slew and output capacitive load values used to obtain those data points. In order to determine the cell delay at other input voltage slew or output capacitive load values, linear interpolation between the measured data points is used.

It is also known to fit the delay measurement data to a multi-variable polynomial model. The polynomial model can then be evaluated at any input voltage slew and output capacitive load values in order to obtain the corresponding delay. Examples of polynomial modeling techniques of this type are disclosed in F. Wang et al., "Scalable Polynomial Delay Model for Logic and Physical Synthesis," Synopsys Inc., 2000, and U.S. Pat. No. 6,272,664, entitled "System and Method for Using Scalable Polynomials to Translate a Look-Up Table Delay Model into a Memory Efficient Model," both incorporated by reference herein. Polynomial models can also be configured to incorporate additional independent variables, such as supply voltage and temperature.

A problem with these and other known polynomial modeling techniques is that such techniques often fail to provide sufficient accuracy, particularly in those portions of a given modeling space in which certain independent variables, such as input voltage slew and output capacitive load, experience their greatest rates of change. The conventional techniques may therefore require the generation of additional measured data points, which can be a prohibitively time-consuming process in many applications.

Accordingly, a need exists for an improved polynomial modeling technique that provides a higher level of accuracy without significantly increasing the complexity of the modeling process and its associated computation and storage requirements.

SUMMARY OF THE INVENTION

The present invention in an illustrative embodiment meets the above-noted need by providing improved techniques for modeling a cell of an integrated circuit design.

In one aspect of the invention, a full-space polynomial model is fit to cell information comprising measured data points associated with one or more independent variables such as voltage slew, capacitive load, supply voltage or temperature. The cell information may comprise, for example, cell timing information such as propagation delay or output voltage slew, timing constraints such as setup and hold times, or other types of information, such as power consumption or capacitive load. Error values are generated indicative of error between the measured data points and the full-space polynomial model. The error values are used to partition the modeling space into domains. For at least a given one of the domains, a first polynomial model is generated based on a subset of the measured data points and at least one additional data point determined by interpolation from the measured data points in the subset. Error values are generated indicative of error between the measured data points of the subset and the first polynomial model. A shifted model is generated by applying correction factors determined from the error values to respective data points taken from the first polynomial model. A second polynomial model of the given domain is generated by fitting to a plurality of data points from the shifted model.

The measured data points may be stored in the form of a multidimensional table having dimensions indexed by respective ones of the independent variables. By way of example, the measured data points may comprise a plurality of cell propagation delay values determined at different values of one or more of the independent variables. As another example, the measured data points may comprise a plurality of cell timing constraints, such as setup times or hold times, determined at different values of one or more of the independent variables. As mentioned previously, the measured data points may comprise other types of cell information, such as power consumption or capacitive load values.

In accordance with another aspect of the invention, the modeling space may be partitioned into an arbitrary number N of domains for a particular dimension, such that for the independent variable corresponding to that dimension, error is substantially equally distributed across the N domains. As a more specific partitioning example, the modeling space may be partitioned such that for a given one of the independent variables, a total error above a given partition boundary is substantially the same as a total error below the given partition boundary. These and other types of partitioning may result in arrangements in which at least two of the domains have different sizes.

The modeling techniques in an illustrative embodiment overcome the above-described disadvantages of conventional practice. For example, such techniques can provide improved modeling accuracy, particularly for portions of the modeling space in which independent variables, such as input voltage slew and output capacitive load, experience their greatest rates of change. Moreover, this enhanced accuracy is provided without significantly increasing the amount of computation and memory resources that are consumed in generating the models or in utilizing the models to perform timing analysis or other processing on an integrated circuit design. The data generation using the shifted model in the illustrative embodiment helps to fit non-linearities in the data that would otherwise be difficult to fit using conventional techniques, while also avoiding the need for time-consuming measurement of additional data points.

BRIEF DESCRIPTION OF THE DRAWINGS

FIG. 5 shows an example of a 2D table that is utilizable in the modeling technique of FIG. 3.

DETAILED DESCRIPTION OF THE INVENTION

The present invention will be described herein in conjunction with illustrative embodiments of a data processing system and associated modeling techniques. It should be understood, however, that the invention is not limited to the illustrative embodiments presented herein. Numerous modifications of the illustrative embodiments will be readily apparent to those skilled in the art.

Figure 1:
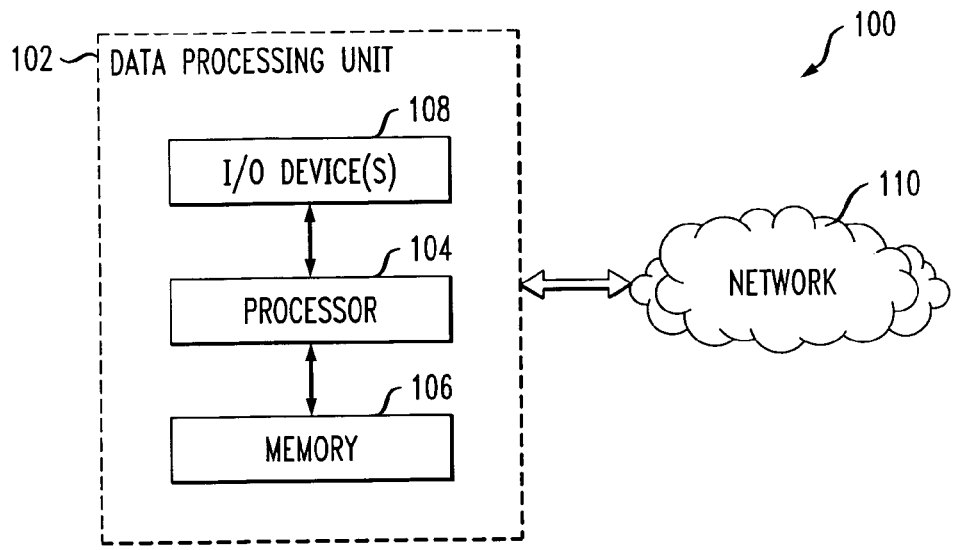
FIG. 1 is a block diagram of a data processing system which incorporates a multi-variable polynomial modeling technique in an illustrative embodiment of the invention.

FIG. 1 shows a data processing system 100 which implements a multi-variable polynomial modeling technique for modeling cell propagation delay in an illustrative embodiment of the invention. The system 100 comprises a data processing unit 102 which includes a processor 104, a memory 106, and one or more input/output (I/O) devices 108, interconnected as shown. The data processing unit 102 in this embodiment is coupled to a network 110, although in other embodiments need not be connected to a network. One or more software programs for integrated circuit design using multi-variable polynomial modeling are stored in memory 106 of data processing unit 102, and executed by the processor 104 of data processing unit 102.

The data processing unit 102 may comprise, for example, a computer, a workstation, a computer-aided design (CAD) terminal, or other processor-based device configured to implement at least a portion of a multi-variable polynomial modeling technique as described below. The conventional aspects of such devices are well known to those skilled in the art and will therefore not be further described herein.

A designer may interact with the data processing unit 102 through one or more display monitors, keyboards, computer pointing devices, etc. The interaction preferably occurs via a graphical user interface. The connection with network 110 allows the data processing unit 102 to access files and data external to itself. Of course, this particular configuration is presented by way of example only, and numerous alternative configurations may be used in implementing the invention.

Figure 2:
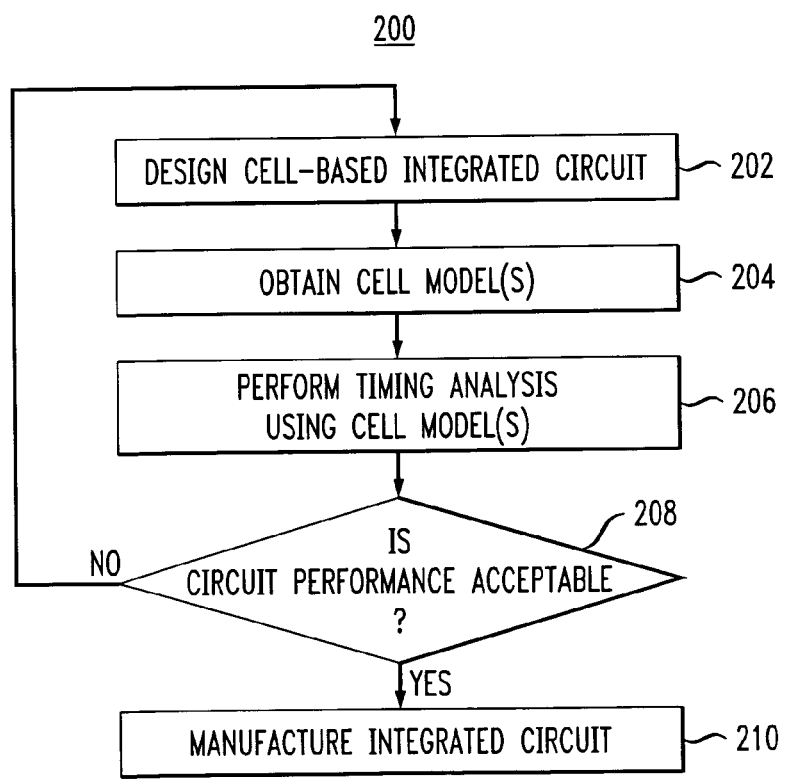
FIG. 2 is a flow diagram of an exemplary integrated circuit design process that may be implemented at least in part in the data processing system of FIG. 1.

FIG. 2 shows a flow diagram 200 of an integrated circuit design process that may be implemented at least in part in the data processing system 100 of FIG. 1.

In step 202, a designer designs a cell-based integrated circuit using circuit design software running on the data processing unit 102. As indicated previously herein, such a design process typically involves interconnecting various building blocks, commonly referred to as cells, which perform specified circuit functions. Such cells may correspond, for example, to particular predetermined arrangements of one or more logic gates, flip-flops, latches, etc.

Once the initial design is complete, one or more cell models are obtained in step 204, and timing analysis is performed using the cell model(s) in step 206. Other types of processing of the integrated circuit design using the cell model(s) may be used in place of the timing analysis of step 206, as will be appreciated by those skilled in the art. A given cell model may be obtained using the process to be described below in conjunction with FIG. 3. In one possible implementation, a given cell model can be generated by the data processing unit 102 as needed. In other embodiments, one or more cell models may be generated in the manner shown in FIG. 3 but on a different computer or other processing device, and subsequently supplied to the data processing unit 102 via network 110 as needed. As another alternative, one or more cell models may be generated in the manner shown in FIG. 3 using data processing unit 102 or a different computer or other processing device, and then stored in a file system of the memory 106 so as to be available for access in step 204. The timing analysis in step 206 may be performed using conventional techniques.

The design process 200 is iterative, and thus if the circuit performance is determined in step 208 to be unacceptable, the process returns to step 202 such that the design can be adjusted. Steps 204 and 206 are then repeated for the adjusted design. This iterative process continues until the circuit performance is acceptable, at which point the integrated circuit design can be manufactured as indicated in step 210.

It is to be appreciated that the particular steps of the FIG. 2 process are greatly simplified for clarity of illustration, and numerous additional or alternative steps of a conventional nature may be incorporated into a given embodiment of such a process.

Figure 3:
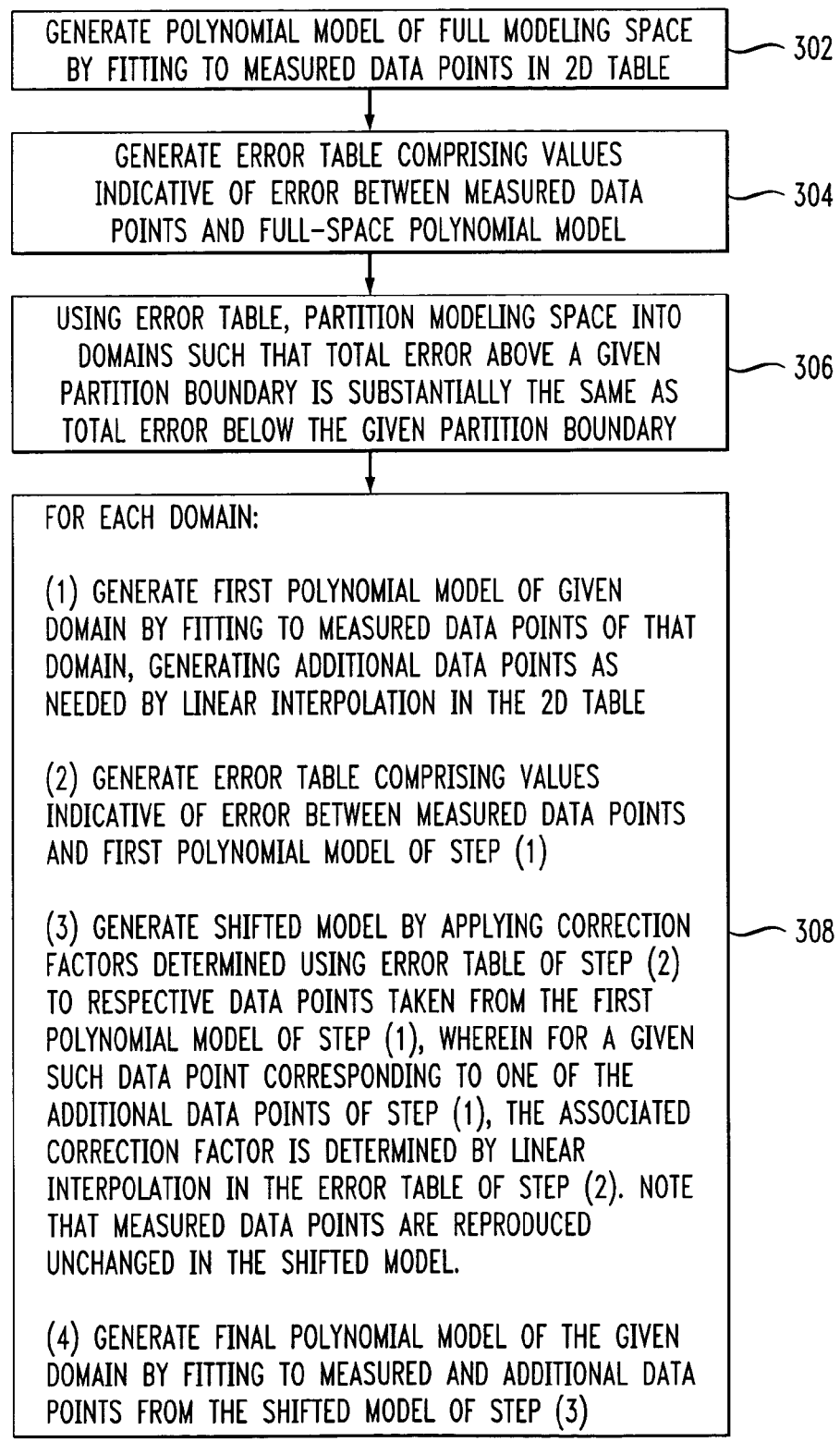
FIG. 3 is a flow diagram of an exemplary multi-variable polynomial modeling technique that is implementable in the system of FIG. 1.

Referring now to FIG. 3, a flow diagram 300 shows how a given cell model can be generated in an illustrative embodiment of the invention. Such a cell model, once generated, can be utilized in the timing analysis of step 206 in FIG. 2. As noted above, the given cell model can be generated as needed, or generated prior to need and stored in data processing unit 102 or in another memory accessible over the network 110.

The particular model generated in the FIG. 3 process is assumed to be for a cell utilizable as a design element in step 202 of FIG. 2. Such a cell need not have any particular structure or functionality, and may comprise a logic gate, a flip-flop, a latch, etc. as well as combinations of such elements.

In step 302, a polynomial model is generated by fitting to measured data points in a 2D table. This polynomial model characterizes the full modeling space associated with the 2D table. As noted above, such a table may comprise timing information in the form of measured data points indexed by the particular independent variable values, such as particular input voltage slew and output capacitive load values, that are used to obtain those data points. An example of such a table is shown in FIG. 5 and described in greater detail below. In this illustrative embodiment, it will be assumed that the 2D table is indexed by input voltage slew and output capacitive load, although it should be understood that other independent variables may be used. The timing information used in step 302, and other arrangements of timing information utilizable with the present invention, may comprise, for example, cell timing information such as propagation delay or output voltage slew, or timing constraints, such as setup and hold times, or any other type of timing information that may be modeled using the techniques described herein, in any combination. The FIG. 3 process can also be adapted in a straightforward manner to other types of cell information including, for example, power consumption, capacitive load, etc.

The polynomial model of step 302, and other polynomial models referred to herein, may be generated, for example, using the following Scalable Polynomial Model (SPM):

$$\sum_{f=0}^{s}\sum_{e=0}^{r}\sum_{d=0}^{q}\sum_{c=0}^{p}\sum_{b=0}^{n}\sum_{a=0}^{m}A_{abcdef}x_1^a x_2^b x_3^c x_4^d x_5^e x_6^f$$

This model supports up to six variables, each of an arbitrary order. Further details can be found in the above-cited F. Wang et al. reference. These and numerous alternative techniques for fitting polynomial models to data points are known in the art, and therefore are not described in detail herein. The term "polynomial model" as used herein is intended to be construed broadly, and should not be interpreted as being restricted to the above example, or any other particular type of mathematical function or format.

The polynomial model generated in step 302 will typically be selected to have an order which allows it to be fit to the measured data of the 2D table. Alternatively, if additional data is needed to fit the measured data to a particular polynomial model in step 302, such additional data may be generated, for example, by linear interpolation between the measured data points of the 2D table, using well-known techniques. Other types of interpolation from one or more measured data points can also or alternatively be used. Such additional data may be needed, for example, in order to provide sufficient data for fitting to a polynomial model of a particular order, in that there must be at least as many data points as there are parameters in the model. Also, additional data can facilitate the partitioning of the modeling space into separate domains, such that different models can be used for different domains, as will be described below. Of course, as indicated previously, selecting the order of the polynomial model in step 302 to accommodate the measured data available in the 2D table avoids the need for generation of additional data at this stage of the process.

In step 304, an error table is generated comprising values indicative of error between the measured data points and the full-space polynomial model. The error value for a given measured data point is determined as the difference between: (i) the measured data point; and (ii) the value of the full-space polynomial model evaluated at the input voltage slew and output capacitive load values used to obtain the measured data point.

In step 306, the error table is used to partition the modeling space into domains such that total error above a given partition boundary is substantially the same as total error below the given partition boundary. The total error can be determined by summing the error values, taking an average, or using other techniques. An example of this partitioning process is described in greater detail below in conjunction with FIG. 6. The operations of step 308 are applied in this embodiment to each of the domains which result from the partitioning in step 306. In other embodiments, the operations of step 308, or portions or alternatives thereof, may be applied to only a subset of the domains. The operations of step 308 as applied to a given domain, more particularly denoted as steps (1) through (4), are as follows:

1. Generate a first polynomial model of the given domain by fitting to the measured data points of that domain. Any additional data points that are needed to accommodate the polynomial model are generated as needed by linear interpolation in the 2D table of step 302. Other types of interpolation, linear or non-linear, may be used, based on one or more of the measured data points.

2. Generate an error table comprising values indicative of error between the measured data points and the first polynomial model of step (1). As above, the error value for a given measured data point is determined as the difference between: (i) the measured data point; and (ii) the value of the first polynomial model evaluated at the input voltage slew and output capacitive load values used to obtain the measured data point.

3. Generate a shifted model by applying correction factors determined from the error table of step (2) to respective data points taken from the first polynomial model of step (1). For a given such data point corresponding to one of the additional data points of step (1), the associated correction factor is determined by linear interpolation in the error table of step (2). For any data points which correspond to measured data points from the 2D table, their correction factors are the respective error value from the error table of step (2). Thus, applying such correction factors simply reproduces the measured data points unchanged in the shifted model. In between measured points, the data generated by the shifted model will follow the shape of the first polynomial model because the correction factor is interpolated between the measured data and applied to a value taken from the first polynomial model at the in-between point. If the first polynomial model is a reasonably good fit to the data, then its shape likely provides a better representation of the missing data than linear interpolation would. Thus, a model re-fitted with data generated in this way should fit even better.

4. Generate a final polynomial model of the given domain by fitting to the measured and additional data points from the shifted model of step (3).

As indicated previously, these operations of step 308 are repeated in the illustrative embodiment for each domain in the modeling space, but in other embodiments could be used for only a single domain, or other subset of the domains.

Also, although described in the context of a single 2D table, the FIG. 3 process can be adapted in a straightforward manner to operate with multiple such tables, as well as with one or more tables of higher dimension.

Figure 4B:
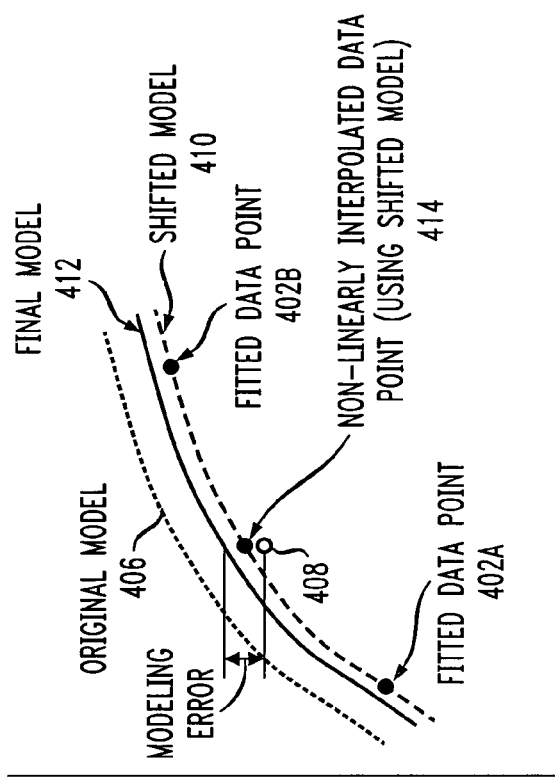
FIGS. 4A and 4B illustrate certain aspects of the modeling technique of FIG. 3.
Figure 4A:
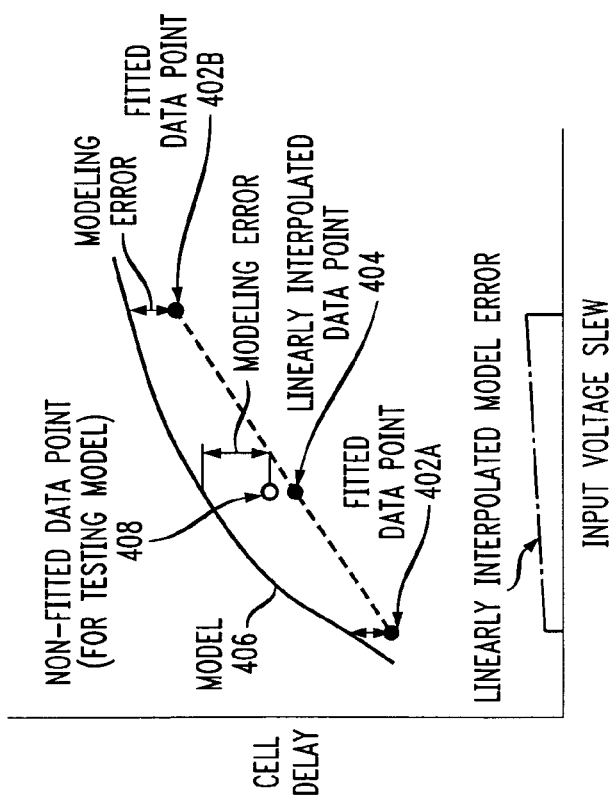

FIGS. 4A and 4B illustrate various aspects of element 308 of the FIG. 3 process as applied to a given domain. In this example, it is again assumed that the 2D table is a table of cell delay values indexed by input voltage slew and output capacitive load. These drawings present measured data points of the 2D table using plots of cell delay as a function of input voltage slew for a given value of output capacitive load. Such plots are also commonly referred to as "timing arcs." The plots in this example are considerably simplified for clarity of illustration, and it should be understood that in typical practice a significantly larger number of data points will be used to generate a particular polynomial model.

Referring initially to FIG. 4A, measured data points 402A and 402B from the given domain are taken from the 2D table, and these points as well as an additional data point 404 are fit to a first polynomial model 406 in accordance with step (1) of element 308 in FIG. 3. The additional data point 404 is generated by linear interpolation between points 402A and 402B of the 2D table. Point 408 represents a non-fitted measured data point that is used for testing the quality of the polynomial model 406. The diagram in FIG. 4A also shows the modeling error between each of the measured data points 402A and 404B and the first polynomial model 406. These error values are stored in an error table in accordance with step (2) of element 308. A representation of linearly interpolated error determined error values for measured data points 402A and 402B is shown at the bottom of the FIG. 4A diagram.

FIG. 4B illustrates the generation of a shifted model 410 and a final polynomial model 412 in accordance with steps (3) and (4), respectively, of element 308 in FIG. 3. The shifted model 410 is generated by applying correction factors to respective data points taken from the first polynomial model of step (1).

For the two data points that correspond to measured data points 402A and 402B, the correction factors that are applied are the respective error values from the error table of step (2), and application of such correction factors reproduces the original measured data points 402A and 402B. Thus, measured data points 402A and 402B are shown as falling on the shifted model 410 in FIG. 4B. However, for the data point corresponding to additional data point 404 of FIG. 4A, the correction factor that is applied is determined by linear interpolation between the error values corresponding to data points 402A and 402B in the error table of step (2). This results in additional data point 414 on the shifted model 410. As noted above, such additional data points from the shifted model will follow the shape of the first polynomial model because their respective correction factors are interpolated between measured data points and applied to respective values taken from the first polynomial model. The final polynomial model 412 is generated by fitting to the measured data points 402A, 402B and the additional data point 414 from the shifted model 410 of step (3).

Operations similar to those illustrated in FIGS. 4A and 4B may be applied to one or more additional domains of the partitioned modeling space, as indicated previously.

It is to be appreciated that the particular processing steps shown and described in conjunction with the flow diagrams of FIGS. 2 and 3 and the plots of FIGS. 4A and 4B are presented by way of illustrative example only, and alternative embodiments may alter the processing steps, include additional steps, use only a subset of the steps, etc.

As indicated above, FIG. 5 shows an example of a 2D table that may be utilized in the FIG. 3 process. The 2D table shown presents measured data points of propagation delay for a given cell, indexed by two independent variables, namely, input voltage slew, represented by index_1, and output capacitive load, represented by index_2. The measured data points are determined for constant values of supply voltage and temperature. Note that the measured data point (0.014718, 0.00000) in the upper left corner of the table corresponds to the delay value of 0.014860. Input voltage slew increases downward with each of seven rows and output capacitive load increases across with each of eight columns.

Of course, this particular table is merely one example of a 2D table that may be utilized in conjunction with the present invention. Alternative tables may comprise timing information other than propagation delay values. For example, a given 2D table could comprise timing constraint data, such as setup times or hold times, in which case the two independent variables would typically represent different voltage slews. Thus, the term "table" as used herein is intended to be construed broadly, and should not be interpreted as requiring any particular arrangement of rows, columns or other characteristics. Moreover, the present invention can be implemented using non-tabular arrangements of data or error values, as will be readily appreciated by those skilled in the art.

Figure 6:
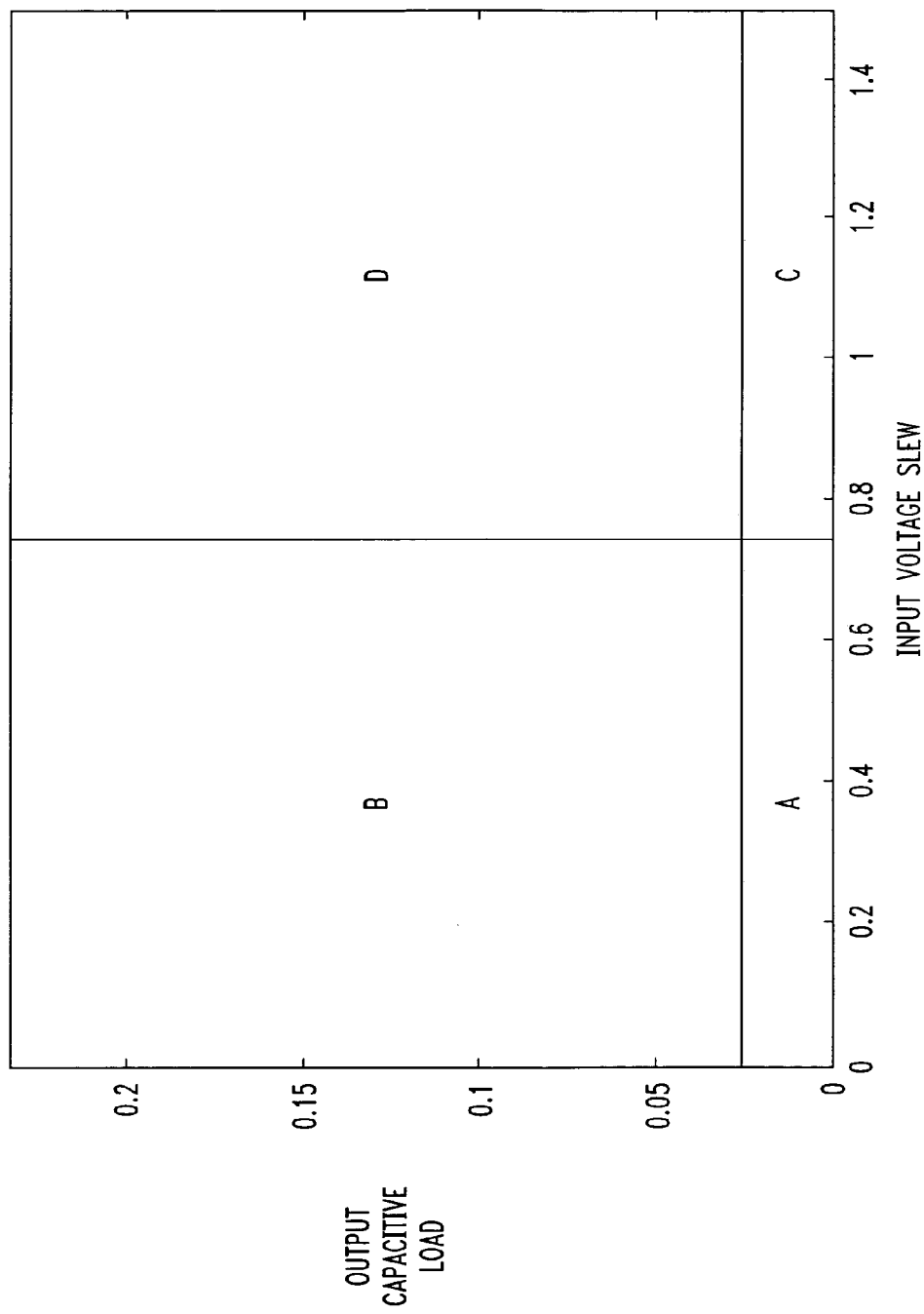
FIG. 6 illustrates a partitioning of the modeling space associated with the 2D table of FIG. 5 into four domains.

FIG. 6 illustrates the manner in which a 2D table such as that shown in FIG. 5 can be partitioned into domains in accordance with step 306 of the FIG. 3 process. In this example, the modeling space including a range of values for input voltage slew on the x-axis and output capacitive load on the y-axis is partitioned so as to balance, for each of these two independent variables, the total error above and below the partition boundary. This results in the space being separated into four domains, denoted A, B, C and D in the figure. Four distinct models may then be generated, one for each domain, in accordance with the FIG. 3 process. These four models, taken together, model the entire space. It should be noted that it is usually desirable to provide some overlap between the different domains, so as to avoid large discontinuities in the models as one crosses a domain boundary.

Notice that in this example, the input voltage slew divided more or less evenly, while the output capacitive load is skewed toward the smaller values. This is dependent on the characteristics of the particular data of the 2D table, as well as the original polynomial model fit, and will thus likely differ from case to case.

Alternative modeling space partitioning approaches may be used, such as, for example, using fixed, fractional or other predetermined domain sizes, or combinations of predetermined and dynamic techniques.

As one example of a more general alternative partitioning approach, the modeling space may be partitioned into an arbitrary number N of domains for a particular dimension, such that for the independent variable corresponding to that dimension, error is substantially equally distributed across the N domains. Different values of N may be used for different dimensions of the modeling space. Also, it is possible to partition only a subset of the dimensions of a modeling space. These and other variants are intended to be included within the general process of "partitioning a modeling space into domains" as that phrase is used herein.

Advantageously, the modeling technique of the FIG. 3 embodiment provides improved modeling accuracy, particularly for portions of the modeling space in which independent variables, such as input voltage slew and output capacitive load, experience their greatest rates of change. Moreover, it provides this enhanced accuracy without significantly increasing the amount of computation and memory resources that are consumed in generating the models or in utilizing the models to perform timing analysis or other processing on an integrated circuit design. The data generation using the shifted model in the illustrative embodiments helps to fit non-linearities in the data that would otherwise be difficult to fit using conventional techniques, and without the need for time-consuming measurement of additional data points.

As indicated previously, the present invention in the illustrative embodiments may be implemented at least in part in the form of one or more software programs that are stored in an electronic memory, on a magnetic or optical disk, or in another type of storage device. Such software may be stored and executed in the data processing unit 102 of FIG. 1, as previously indicated.

In manufacturing integrated circuits designed using the techniques of the illustrative embodiments, identical die are typically formed in a repeated manner on a surface of a semiconductor wafer. Each die includes one or more devices corresponding to cells of the type described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It should again be emphasized that the above-described embodiments of the invention are intended to be illustrative only. No limitation with respect to the specific embodiments described herein is intended or should be inferred. Other embodiments can use different types and arrangements of elements for implementing the described functionality. For example, the particular types of cell information, models and tables used, the manner in which the modeling space is partitioned, the manner in which error values and additional data points are determined, and so on may be varied to accommodate the particular needs of a given application. These and numerous other alternative embodiments within the scope of the following claims will be apparent to one skilled in the art.

What is claimed is:

1. A method of modeling a cell of an integrated circuit design, the method comprising the steps of:
   generating a polynomial model of a modeling space by fitting to cell information comprising measured data points associated with one or more independent variables;
   generating error values indicative of error between the measured data points and the polynomial model of the modeling space;
   partitioning the modeling space into domains having boundaries based on the error values; and
   for at least a given one of the domains, performing the following steps:
      (i) generating a first polynomial model of given domain by fitting to a plurality of data points including a subset of the measured data points and at least one additional data point determined by interpolation from one or more of the measured data points in the subset;
      (ii) generating error values indicative of error between the measured data points of the subset and the first polynomial model of step (i);
      (iii) generating a shifted model by applying correction factors determined from the error values of step (ii) to respective data points taken from the first polynomial model of step (i), wherein for a given such data point corresponding to the additional data point of step (i), the associated correction factor is determined by interpolation from one or more of the error values of step (ii); and
      (iv) generating a second polynomial model of the given domain by fitting to a plurality of data points from the shifted model of step (iii);
   wherein the integrated circuit design is processed using at least the second polynomial model of the given domain in order to determine if the integrated circuit design meets specified performance criteria.

2. The method of claim 1 wherein the measured data points comprise a plurality of cell propagation delay or output voltage slew values determined at different values of one or more of the independent variables.

3. The method of claim 1 wherein the measured data points comprise a plurality of cell timing constraints determined at different values of one or more of the independent variables.

4. The method of claim 1 wherein the measured data points are stored in the form of a multidimensional table having dimensions indexed by respective ones of the independent variables.

5. The method of claim 1 wherein the one or more independent variables comprise one or more of voltage slew, load capacitance, supply voltage and temperature.

6. The method of claim 1 wherein the partitioning step comprises partitioning the modeling space into a designated number N of domains for a particular dimension, such that for a corresponding one of the independent variables, error is substantially equally distributed across the N domains.

7. The method of claim 1 wherein the partitioning step comprises partitioning the modeling space into domains such that for a given one of the independent variables, a total error above a given partition boundary is substantially the same as a total error below the given partition boundary.

8. The method of claim 1 wherein the partitioning step comprises partitioning the modeling space into domains such that at least two of the domains have different sizes.

9. The method of claim 1 wherein the partitioning step comprises partitioning the modeling space into domains such that a domain comprising a portion of the modeling space in which a given independent variable experiences its greatest rate of change includes a larger number of the measured data points than another domain comprising another portion of the modeling space associated with the given independent variable.

10. The method of claim 1 wherein, in generating the first polynomial model of the given domain, the at least one additional data point is determined by linear interpolation between a corresponding pair of the measured data points in the subset.

11. The method of claim 1 wherein, in generating the shifted model, for the given data point corresponding to the additional data point of step (i), the associated correction factor is determined by linear interpolation between a corresponding pair of the error values of step (ii).

12. The method of claim 1 wherein steps (i) through (iv) are repeated for each of the plurality of domains, thereby producing a plurality of second polynomial models corresponding to respective ones of the domains, the plurality of second polynomial models collectively covering the modeling space.

13. The method of claim 12 wherein one or more of the domains each overlap with at least one other one of the domains at corresponding partition boundaries thereof in a manner that prevents discontinuities between the plurality of second polynomial models.

14. The method of claim 1 wherein for data points of the shifted model corresponding to measured data points in the subset, the correction factors applied in step (iii) are respective ones of the error values of step (ii), such that the measured data points in the subset are reproduced in the shifted model.

15. The method of claim 1 wherein if the integrated circuit design does not meet the specified performance criteria, the integrated circuit design is adjusted and the steps of the process are repeated for the adjusted design.

16. The method of claim 1 wherein the steps are performed on a first processing device and the processing of the integrated circuit design using the second polynomial model of the given domain is performed on a second processing device that is separate from the first processing device.

17. The method of claim 1 wherein the steps are performed on a first processing device and the processing of the integrated circuit design using the second polynomial model of the given domain is also performed on the first processing device.

18. The method of claim 1 wherein the steps are implemented in software running on a processing device comprising a memory and a processor coupled to the memory.

19. An apparatus for use in modeling a cell of an integrated circuit design, the apparatus comprising:
   a processing device comprising a memory and a processor coupled to the memory;
   wherein the processor is configured to perform the steps of:
   generating a polynomial model of a modeling space by fitting to cell information comprising measured data points associated with one or more independent variables;

generating error values indicative of error between the measured data points and the polynomial model of the modeling space;

partitioning the modeling space into domains having boundaries based on the error values; and for at least a given one of the domains, performing the following steps:
  (i) generating a first polynomial model of given domain by fitting to a plurality of data points including a subset of the measured data points and at least one additional data point determined by interpolation from one or more of the measured data points in the subset;
  (ii) generating error values indicative of error between the measured data points of the subset and the first polynomial model of step (i);
  (iii) generating a shifted model by applying correction factors determined from the error values of step (ii) to respective data points taken from the first polynomial model of step (i), wherein for a given such data point corresponding to the additional data point of step (i), the associated correction factor is determined by interpolation from one or more of the error values of step (ii); and
  (iv) generating a second polynomial model of the given domain by fitting to a plurality of data points from the shifted model of step (iii);

wherein the integrated circuit design is processed using at least the second polynomial model of the given domain in order to determine if the integrated circuit design meets specified performance criteria.

20. An article of manufacture for use in modeling a cell of an integrated circuit design, the article of manufacture comprising a storage medium containing one or more software programs which, when executed by a processing device, perform the steps of:

generating a polynomial model of a modeling space by fitting to cell information comprising measured data points associated with one or more independent variables;

generating error values indicative of error between the measured data points and the polynomial model of the modeling space;

partitioning the modeling space into domains having boundaries based on the error values; and for at least a given one of the domains, performing the following steps:
  (i) generating a first polynomial model of given domain by fitting to a plurality of data points including a subset of the measured data points and at least one additional data point determined by interpolation from one or more of the measured data points in the subset;
  (ii) generating error values indicative of error between the measured data points of the subset and the first polynomial model of step (i);
  (iii) generating a shifted model by applying correction factors determined from the error values of step (ii) to respective data points taken from the first polynomial model of step (i), wherein for a given such data point corresponding to the additional data point of step (i), the associated correction factor is determined by interpolation from one or more of the error values of step (ii); and
  (iv) generating a second polynomial model of the given domain by fining to a plurality of data points from the shifted model of step (iii);

wherein the integrated circuit design is processed using at least the second polynomial model of the given domain in order to determine if the integrated circuit design meets specified performance criteria.

* * * * *